United States Patent [19]

Nilssen

[11] Patent Number: 5,371,441
[45] Date of Patent: * Dec. 6, 1994

[54] PLUG-IN ELECTRONIC LIGHTING PRODUCT

[76] Inventor: Ole K. Nilssen, Caesar Dr., Barrington, Ill. 60010

[*] Notice: The portion of the term of this patent subsequent to Aug. 30, 2011 has been disclaimed.

[21] Appl. No.: 235,869

[22] Filed: May 2, 1994

Related U.S. Application Data

[63] Continuation of Ser. No. 77,260, Jun. 17, 1993, Pat. No. 5,343,124, which is a continuation of Ser. No. 708,985, Mar. 6, 1985, abandoned, and a continuation-in-part of Ser. No. 47,944, Apr. 16, 1993, which is a continuation-in-part of Ser. No. 955,229, Oct. 1, 1992, Pat. No. 5,233,270, which is a continuation-in-part of Ser. No. 607,271, Oct. 31, 1990, abandoned, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned, said Ser. No. 77,260, is a continuation-in-part of Ser. No. 62,329, May 17, 1993, which is a continuation of Ser. No. 700,049, May 8, 1991, abandoned, which is a continuation of Ser. No. 489,096, Apr. 27, 1983, abandoned, which is a continuation-in-part of Ser. No. 178,107, Aug. 14, 1980, abandoned.

[51] Int. Cl.$^5$ .............. H05B 41/00; H05B 41/29
[52] U.S. Cl. .............. 315/209 R; 315/224; 361/35; 361/674; 362/226; 362/410
[58] Field of Search .............. 315/205, 224, 209 R; 307/326, 327, 328; 361/18, 35, 37, 38, 93, 94, 102, 674; 362/226, 410, 411, 457

[56] References Cited

U.S. PATENT DOCUMENTS

| | | | |
|---|---|---|---|
| 2,910,625 | 10/1959 | Carpenter | 361/35 |
| 4,651,059 | 3/1987 | Nilssen | 361/35 X |
| 5,047,696 | 9/1991 | Nilssen | 361/674 X |
| 5,065,292 | 11/1991 | Aubrey | 362/410 X |

Primary Examiner—David Mis

[57] ABSTRACT

A power supply is integrally combined with a power plug, and the combination is adapted to be plugged into an ordinary household electrical outlet and operable to provide a power-line-isolated output of 120 Volt RMS at a frequency of about 30 kHz. The Volt-Ampere product available from this power supply is limited to be no more than 100 Volt-Ampere. Due to the high frequency, the electric shock hazard associated with this 120 Volt/30 kHz power supply is not higher than it is for a power supply having a voltage of only 30 Volt RMS at 60 Hz. The power supply, which also has receptacle means operable to receive and hold an ordinary electric power plug, is interposed between an ordinary household electrical outlet and the power plug of an ordinary table lamp. Thus, while ordinary 120 Volt incandescent light bulbs may effectively be used in the socket of this table lamp, the socket voltage—even though being of 120 Volt RMS magnitude—is substantially free from serious electric shock hazard due to its high frequency.

20 Claims, 1 Drawing Sheet

PLUG-IN ELECTRONIC LIGHTING PRODUCT

Related Applications

This application is a continuation of Ser. No. 08/077,260 filed Jun. 17, 1993; which is a continuation of Ser. No. 06/708,985 filed Mar. 6, 1985, now abandoned.

Application Ser. No. 08/077,260 is also a continuation-in-part of Ser. No. 08/047,944 filed Apr. 16, 1993; which is a continuation-in-part of Ser. No. 07/955,229 filed Oct. 1, 1992, now U.S. Pat. No. 5,233,290; which is a continuation-in-part of Ser. No. 07/607,271 filed Oct. 31, 1990, now abandoned; which is a continuation-in-part of Ser. 06/787,692 filed Oct. 15, 1985, now abandoned; which is a continuation of Ser. No. 06/644,155 filed Aug. 27, 1984, now abandoned; which is a continuation of Ser. No. 06/555,426 filed Nov. 23, 1983, now abandoned; which is a continuation of Ser. No. 06/178,107 filed Aug. 14, 1980, now abandoned.

Application Ser. No. 08/077,260 is also a continuation-in-part of Ser. No. 08/062,329 filed May 17, 1993; which is a continuation of Ser. No. 07/700,049 filed May 8, 1991, now abandoned; which is a continuation of Ser. No. 06/489,096 filed Apr. 27, 1983, now abandoned; which is a continuation-in-part of Ser. No. 06/178,107 filed Aug. 14, 1980, now abandoned.

FIELD OF INVENTION

The present invention relates to lighting means having sockets operable to receive and power 120 Volt incandescent light bulbs but wherein the socket voltage is conditioned such as to make it substantially free from electric shock hazard.

BACKGROUND AND PRIOR ART

According to Article 725 of NATIONAL ELECTRICAL CODE 1984 —issued by NATIONAL FIRE PROTECTION ASSOCIATION, BATTERYMARCH PARK, QUINCY, MASS. 02269 —as long as output current may exceed 0.005 Amp, a Class-2 electrical circuit is limited to a maximum output voltage of 30 Volt RMS for sinusoidal voltages at power line frequencies. Based on experience, this voltage level is considered to be acceptably safe from electric shock hazards.

A wide variety of plug-mounted Class-2 power supplies are available for purchase. A typical example of such a power supply is a plug-in battery eliminator for a hand-held calculator.

At frequencies substantially higher than 60 Hz, the human body exhibits a significant degree of so-called skin-effect; which causes less penetration of current into the human body while at the same time making the human body more resistive to the flow of current.

For instance, at a frequency of 60 Hz, it is relatively harmless for a person to receive an electric shock that results in a current as high as 0.005 Amp. At 30 kHz, on the other hand, it is about equally harmless for a person to receive an electric shock that results in a current as high as 0.03 Amp.

SUMMARY OF THE INVENTION

Objects of the Invention

One object of the present invention is that of providing a lighting means having a socket operable to receive and power a 120 Volt incandescent lamp but yet being substantially free from serious electric shock hazard.

Another object is that of providing lighting means that are substantially safe from electric shock hazard and/or from fire initiation hazard.

These as well as other important objects and advantages of the present invention will become apparent from the following description.

Brief Description

In its preferred embodiment, subject invention comprises a frequency converting power supply combined with a power plug, with the combination being an integral entity suitable for insertion into and support by an ordinary household electrical outlet. Comprised within this power supply is a full bridge rectifier, a 30 kHz inverter, an isolating voltage transformer, and a current-limiting means. The power-line-isolated current-limited 30 kHz output from the overall power supply is provided at a receptacle adapted to receive a power plug of the type that ordinarily plugs into a regular household electrical receptacle.

The RMS magnitude of the 30 kHz output voltage is about 120 Volt. Because the frequency is so much higher than 60 Hz, the electric shock hazard associated with the 120 Volt/30 kHz output is no worse than that associated with a regular Class-2 30 Volt/60 Hz output. Consequently, since the output is also current-limited such that no more than 100 Volt-Ampere can be provided, the output from the power supply may be considered free of both electric shock hazard and fire-initiation hazard, thereby providing all the safety features normally associated with Class-2 electrical circuits.

The plug-mounted power supply is interposed between an ordinary household electric power outlet and the power plug of an ordinary table lamp, thereby providing 120 Volt/30 kHz voltage at the socket of that table lamp. In this lamp socket, any regular 120 Volt incandescent lamp up to about 100 Watt may now properly be used; yet, the lamp socket may now be considered free from electric shock hazard. This means, for instance, that a child may stick a finger into the live lamp socket without thereby getting a potentially dangerous electrical shock. Moreover, because of the power-limitation, the power cord of the table lamp may now safely be made particularly light of weight and especially flexible.

DESCRIPTION OF THE PREFERRED EMBODIMENT

Details of Construction

Figure 1:
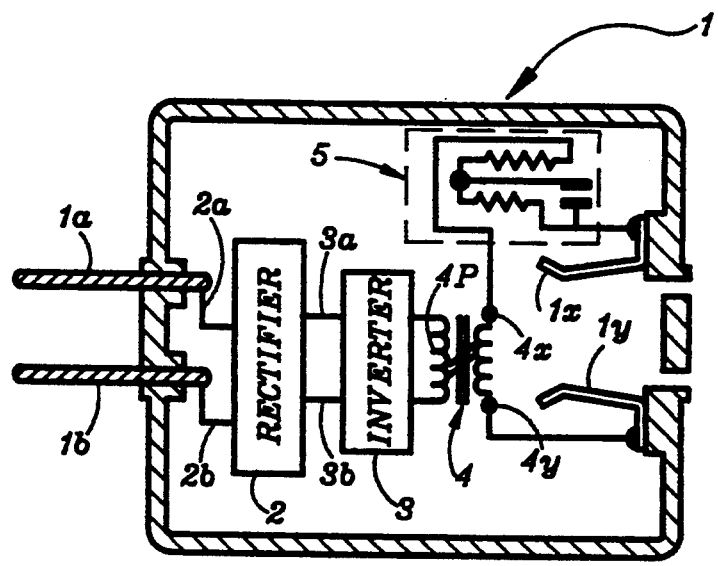
FIG. 1 provides a schematic circuit diagram of the preferred embodiment of the plug-mounted power supply.

In FIG. 1, a plug-mounted power supply is designated by the numeral 1. Rigidly attached to this power supply are two prongs 1a and 1b; which prongs are so sized and positioned as to permit the overall power supply to be plugged into and supported by an ordinary household electrical outlet—such as element 25 in FIG. 2.

Connected with prongs 1a and 1b are terminals 2a and 2b of rectifier means 2. The DC output of this rectifier is applied to power input terminals 3a and 3b of an inverter 3. The relatively high frequency output voltage of this inverter is applied to the primary winding 4P of a transformer 4.

This transformer has a secondary winding having terminals 4x and 4y. Terminal 4y is directly connected with power supply output terminal 1y. Terminal 4x is connected with power supply output terminal 1x by way of current limiting means 5.

Figure 2:
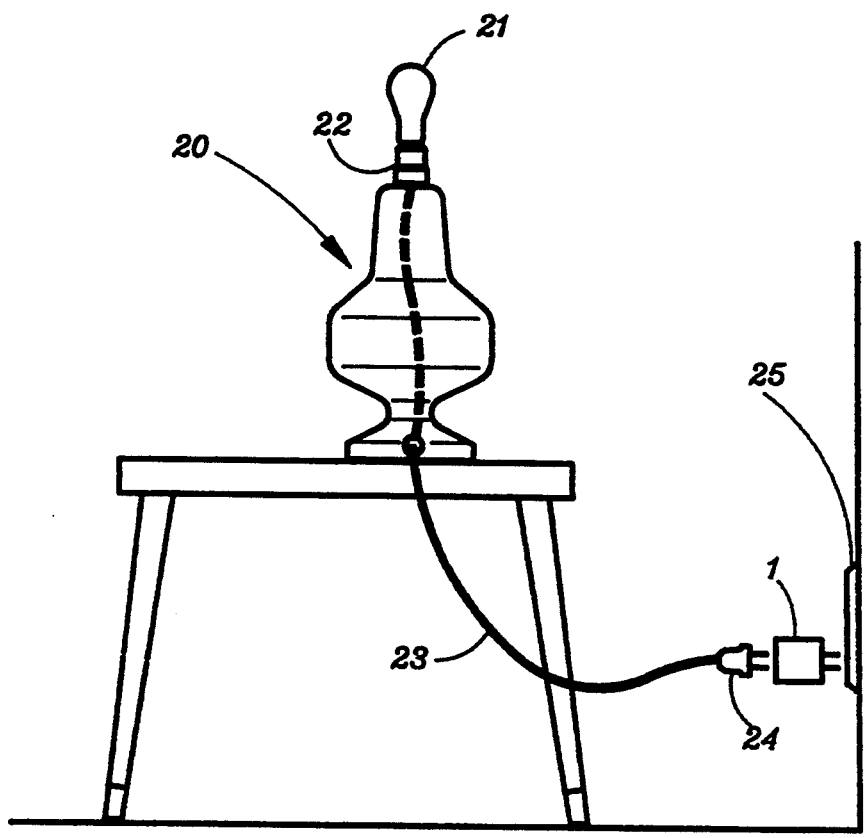
FIG. 2 illustrates the preferred embodiment of the overall invention.

The two power supply output terminals are so arranged as to be able to receive, hold and connect with an ordinary household electric power plug—such as element 24 in FIG. 2.

FIG. 2 illustrates how the power supply of FIG. 1 is used in the invention, and shows a table lamp 20 having an ordinary lamp socket 22 adapted to receive an ordinary Edison-type incandescent lamp 21. The table lamp has a power cord 23 and an ordinary household electrical power plug 24.

Plug-in power supply 1 is shown in a position ready to be plugged into household electrical receptacle 25; and power plug 24 is shown in a position ready to be plugged into and connect with power supply 1.

Details of Operation

When the power supply of FIG. 1 is plugged into an ordinary electrical receptacle, 120 Volt/60 Hz power line voltage is applied to terminals 1a and 1b, rectified by rectifier 2, applied in the form of a DC voltage to inverter 3, and provided in the form of a 30 kHz non-current-limited squarewave voltage to the primary winding 4P of transformer 4.

When non-loaded, the output at the secondary winding of transformer 4 is a 30 kHz squarewave voltage of RMS magnitude approximately equal to 120 Volt. To meet with requirements of the National Electrical Code for Class-2 circuits, the maximum current available from this secondary winding must be limited in such a way that the maximum Volt-Ampere product extractable from terminals 4x and 4y is no more than 250 Volt-Ampere.

This degree of power limitation is provided for by magnetic flux leakage in transformer 4; which is so designed as not to be capable of providing a short circuit current of more than about 8 Amp. (As an alternative, this or any other suitable degree of current-limitation may readily be provided by way of adding an inductor in series with one of the output terminals of the secondary winding.)

The power from the secondary winding of transformer 4 is provided to the power supply output terminals 1x and 1y by way of another and much more sensitive current-limiting means 5. This current-limiting means is a thermally responsive bimetallic circuit breaker; which circuit breaker is actuated by heat generated by the current flowing through the circuit breaker. So as to meet with the requirements of the National Electrical Code, this circuit breaker has been made such as to break the circuit at a current flow of about 0.8 Amp.

Thus, the plug-in/plug-into power supply 1 of FIG. 1 is capable of providing approximately 120 Volt RMS to loads requiring currents as high as 0.8 Amp. Yet, due to the high frequency of the output voltage, this power supply is effectively as safe from electrical shock hazard as if the output voltage were to be only 30 Volt at 60 Hz.

FIG. 2 illustrates the overall invention by way of showing the power supply of FIG. 1 interposed between a regular household electrical outlet and the power plug of a regular table lamp, thereby to provide substantially shock-hazard-free 120 Volt voltage to the lamp socket of that table lamp; which now permits a regular 120 Volt incandescent lamp up to about 100 Watt rating to be effectively used in the lamp socket thereof. Yet, this lamp socket may now be considered safe from electric shock hazard.

In substantial conformance with the National Electrical Code, as well as with the specifications of Underwriters Laboratories Inc. of Northbrook, Ill. 60062, a Class-2 power supply (or a Class-2 transformer, circuit arrangement, etc.) is herewith defined as a power supply having an output that is safe from fire initiation hazard as well as from electric shock hazard, even if a person were to make direct electrical contact with the output.

In substantial conformance with the National Electrical Code, as well as with the specifications of Underwriters Laboratories Inc. of Northbrook, Ill. 60062, a Class-3 power supply is herewith defined as a power supply having an output that is safe from fire initiation hazard but not necessarily safe from electric shock hazard.

Applicant has verified by actual tests that a current flow through the human body of over 0.03 Amp at a frequency of about 30 kHz can not reasonable be regarded as an electric shock, and definitely not a dangerous electric shock. In this connection, it is noted that Underwriters Laboratories prescribes the use of a 500 Ohm resistor to simulate the overall resistance of a human body when exposed to a voltage of 60 Hz frequency. This implies that, at a voltage of 120 Volt, the resulting current would be 0.024 Amp; which is less than the previously defined limit of 0.03 Amp at 30 kHz. In this connection, it should be recognized that at 30 kHz the equivalent resistance of the human body would have to be considered as being a good deal higher than than it is at 60 Hz.

In the power supply of FIG. 1, it is noted that the bridge rectifier 2 and the inverter 3 are both conventional in construction. Thus, the voltage and current limitation associated with the power supply's output is accomplished in a substantially non-dissipative fashion, a feature that is in direct contrast with ordinary Class-2 power supplies.

It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. An arrangement comprising:
a housing means rigidly attached to a pair of electrical prongs plugged into and held by an ordinary household-type electrical receptacle at which is provided an ordinary AC power line voltage; the housing means including electronic circuitry connected with the electrical prongs and operative to provide a high-frequency AC voltage at a pair of power output terminals; the frequency of the high-frequency AC voltage being substantially higher than the frequency of the AC power line voltage; and
a lighting means connected with the power output terminals.

2. The arrangement of claim 1 wherein the housing means is further characterized in that the RMS magnitude of the high-frequency AC voltage is substantially the same as that of the AC power line voltage.

3. The arrangement of claim 1 wherein the lighting means is further characterized as being an ordinary table lamp.

4. The arrangement of claim 1 wherein the housing means is further characterized by having a receptacle means operative to receive and hold an ordinary power plug of a type adapted for plug-in connection with an ordinary household electrical receptacle.

5. The arrangement of claim 1 wherein the housing means is further characterized by including sub-circuitry functional to prevent power extracted from the power output terminals from getting to be so high as to constitute a fire initiation hazard.

6. The arrangement of claim 1 wherein the housing means is further characterized by including sub-circuitry functional to prevent the Volt-Ampere product extracted from the power output terminals from exceeding 250 Volt-Ampere.

7. The arrangement of claim 1 wherein the lighting means is further characterized by including a lamp having a screw base of a type adapted to be screwed into and held by an ordinary Edison-type lamp socket.

8. The arrangement of claim 1 wherein the lighting means is further characterized by including a lamp socket adapted to receive an ordinary Edison-type incandescent lamp.

9. An arrangement comprising:
a plug-mounted power supply rigidly attached to a pair of electrical prongs plugged into and held by an ordinary household-type electrical receptacle at which is provided an ordinary AC power line voltage; the power supply including electronic circuitry connected with the electrical prongs and operative to provide a high-frequency AC voltage at a pair of power output terminals; the frequency of the high-frequency AC voltage being substantially higher than the frequency of the AC power line voltage; and
a lighting means connected with the power output terminals; the lighting means being characterized by including a lamp socket adapted to receive and hold an ordinary Edison-type incandescent lamp.

10. The arrangement of claim 9 wherein the plug-mounted power supply is further characterized by including a receptacle means of a type adapted to receive and hold an ordinary household electric power plug.

11. An arrangement comprising:
a plug-mounted power supply rigidly attached to a pair of electrical prongs plugged into and held by an ordinary household-type electrical receptacle at which is provided an ordinary AC power line voltage; the power supply including electronic circuitry connected with the electrical prongs and operative to provide a high-frequency AC voltage at a pair of power output terminals; the frequency of the high-frequency AC voltage being substantially higher than the frequency of the AC power line voltage; the plug-mounted power supply being further characterized by being operable to deliver electric power from its power output terminals up to, but no higher than, a level considered safe from fire-initiation hazard; and
a lighting means connected with the power output terminals.

12. The arrangement of claim 11 wherein the plug-mounted power supply is additionally characterized by including a receptacle means adapted to receive and hold an ordinary household electric power plug.

13. An arrangement comprising:
a plug-mounted power supply rigidly attached to a pair of electrical prongs plugged into and held by an ordinary household-type electrical receptacle at which is provided an ordinary AC power line voltage; the power supply including electronic circuitry connected with the electrical prongs and operative to connect with, and to provide an AC voltage at, a pair of power output terminals; the electronic circuitry being further characterized by including power-limiting means; the plug-mounted power supply being further characterized by being operable to deliver electric power from its power output terminals up to, but not beyond, a level considered safe from fire-initiation hazard; and
a lighting means connected with the power output terminals.

14. The arrangement of claim 13 wherein the power-limiting means is characterized by including a current-limiting inductive reactance means.

15. An arrangement comprising:
a plug-mounted power supply rigidly attached to a pair of electrical prongs plugged into and held by an ordinary household-type electrical receptacle at which is provided an ordinary AC power line voltage; the plug-mounted power supply being further characterized by: (i) being operable to provide an AC voltage at a pair of power output terminals; (ii) including linear current-limiting means connected in circuit between the electrical prongs and the power output terminals; and (iii) being operable to deliver electric power from its power output terminals up to, but not beyond, a level considered safe from fire-initiation hazard; and
a lighting means connected with the power output terminals.

16. The arrangement of claim 15 wherein the lighting means is further characterized by including a lamp having a pair of lamp terminals across which a high-frequency voltage exists; the high-frequency voltage being of frequency substantially higher than that of the AC power line voltage.

17. An arrangement comprising:
a housing means rigidly attached to a pair of electrical prongs plugged into and held by an ordinary household-type electrical receptacle at which is provided an ordinary AC power line voltage; the housing means including electronic circuitry connected with the electrical prongs and operative to provide a high-frequency AC voltage at a pair of power output terminals; the fundamental frequency of the high-frequency AC voltage being substantially higher than that of the AC power line voltage; the electronic circuitry being further characterized by: (i) including linear current-limiting means; and (ii) being operable to deliver electric power from the power output terminals up to, but not exceeding, a certain level considered safe from fire-initiation hazard; and
a lighting means connected with the power output terminals.

18. The arrangement of claim 17 wherein the housing means is additionally characterized by not including any fusible element.

19. An arrangement comprising:

a plug-mounted power supply rigidly attached to a pair of electrical prongs plugged into and held by an ordinary household-type electrical receptacle at which is provided an ordinary AC power line voltage; the plug-mounted power supply being further characterized by being: (i) operable to provide an AC voltage at a pair of power output terminals; and (ii) functional, without use of a fusible element, to deliver electric power from its power output terminals up to, but not beyond, a certain level considered safe from fire-initiation hazard; and a lighting means connected with the power output terminals.

20. The arrangement of claim 19 wherein the plug-mounted power supply is additionally characterized by including linear power-limiting means functional to prevent the delivery from its power output terminals of power in excess of 250 Watt.

* * * * *